United States Patent [19]
Shiga

[11] Patent Number: 5,164,581
[45] Date of Patent: Nov. 17, 1992

[54] CONCENTRIC PHOTOELECTRIC LIGHT-RECEIVING ELEMENT

[75] Inventor: Nobuo Shiga, Yokohama, Japan

[73] Assignee: Sumitomo Electric Industries, Ltd., Osaka, Japan

[21] Appl. No.: 588,854

[22] Filed: Sep. 27, 1990

[30] Foreign Application Priority Data

Oct. 4, 1989 [JP] Japan .................. 1-259829

[51] Int. Cl.⁵ .................. H01J 40/14
[52] U.S. Cl. .................. 250/208.6; 250/214 A
[58] Field of Search .......... 250/208.6, 227.24, 211 R, 250/211 J; 350/96.15, 96.17; 357/30 D, 30 M

[56] References Cited

U.S. PATENT DOCUMENTS 3,777,149 12/1973 Marcatili .................. 250/208.6
3,777,150 12/1973 Miller .................. 250/208.6
4,882,478 11/1989 Hayashi et al. .................. 250/208.6

Primary Examiner—David C. Nelms
Assistant Examiner—K. Shami
Attorney, Agent, or Firm—Stevens, Davis, Miller & Mosher

[57] ABSTRACT

An invention provides a light receiving element which can monitor a light signal input without causing a disturbance in an output signal. A light receiving element has a first active area irradiated by a major component of an input light signal and a second active area irradiated by a leakage light component of the input light signal. An output optical current for information transmission is generated by the light signal radiated on the first active area, and a monitor light output current is generated by the leakage light component of the light signal radiated on the second active area.

1 Claim, 4 Drawing Sheets

CONCENTRIC PHOTOELECTRIC LIGHT-RECEIVING ELEMENT

BACKGROUND OF THE INVENTION

1. Field of the Invention

The present invention relates to a light-receiving element used in, e.g., an optical communication system such as an optical LAN(local area network) or an optical CATV system.

2. Description of the Related Art

Conventionally, a light signal receiving section in an optical communication system of this type generally employs a circuit arrangement, as shown in FIG. 1. When a light signal is incident on a light-receiving element 1, the light-receiving element 1 generates a light output current. The light output current is converted into a voltage signal by a resistor 2, and the voltage signal is supplied to an amplifier 3. The incident light signal is amplified and demodulated by the amplifier 3, and the demodulated signal is output. The output signal from the amplifier 3 is also supplied to an amplifier 4. The output terminal of the amplifier 4 is connected to diodes 5 and 6, a resistor 7, and a capacitor 8. The output signal supplied to the amplifier 4 is output to a terminal 9 as a monitor signal. Most optical communication systems have a function of monitoring the presence/absence of a light input.

FIG. 2A is a plan view of the light-receiving element 1, and FIG. 2B is a longitudinal sectional view of FIG. 2A. The light-receiving element 1 is formed to have a PIN structure. As an uppermost layer of the PIN structure, an SiO$_2$ (silicon oxide) film 10 is formed. A light signal emitting from an optical fiber is radiated on an active area 11 indicated by hatching in FIG. 2A. A metal wall 12 is formed around the active area 11. Upon radiation of the light signal, the PIN structure generates a light output current. The light output current is output through a lead terminal formed by the metal wall 12.

In the conventional light signal receiving circuit, however, since an electrical signal output from the amplifier 3 is branched to the amplifier 4 and serves as a monitor signal, the light output current generated by the light-receiving element 1 is also consumed by the amplifier 4. Therefore, if incident light power is very weak, a disturbance occurs in a low-level output electrical signal obtained from the amplifier 3. For this reason, information transmission in the optical communication system cannot be accurately performed.

SUMMARY OF THE INVENTION

The present invention has been made to solve the above problem, and has an object to provide a light-receiving element which can perform accurate information transmission even if a light signal is very weak. For this purpose, according to the present invention, a light-receiving element is formed by comprising the first active area irradiated with a light signal, and the second active area irradiated with a leakage component of the light signal. For this reason, an output optical current for information transmission is generated by a light signal radiated on the first active area, and a monitor output optical current is generated by a leakage component of the light signal radiated on the second active area. Therefore, even if an incident light signal is very weak, as the monitor light output current is independently generated, no disturbance occurs in an output electrical signal for information transmission. Therefore, according to the present invention, information transmission in an optical communication system can be accurately performed.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENT

Figure 1:
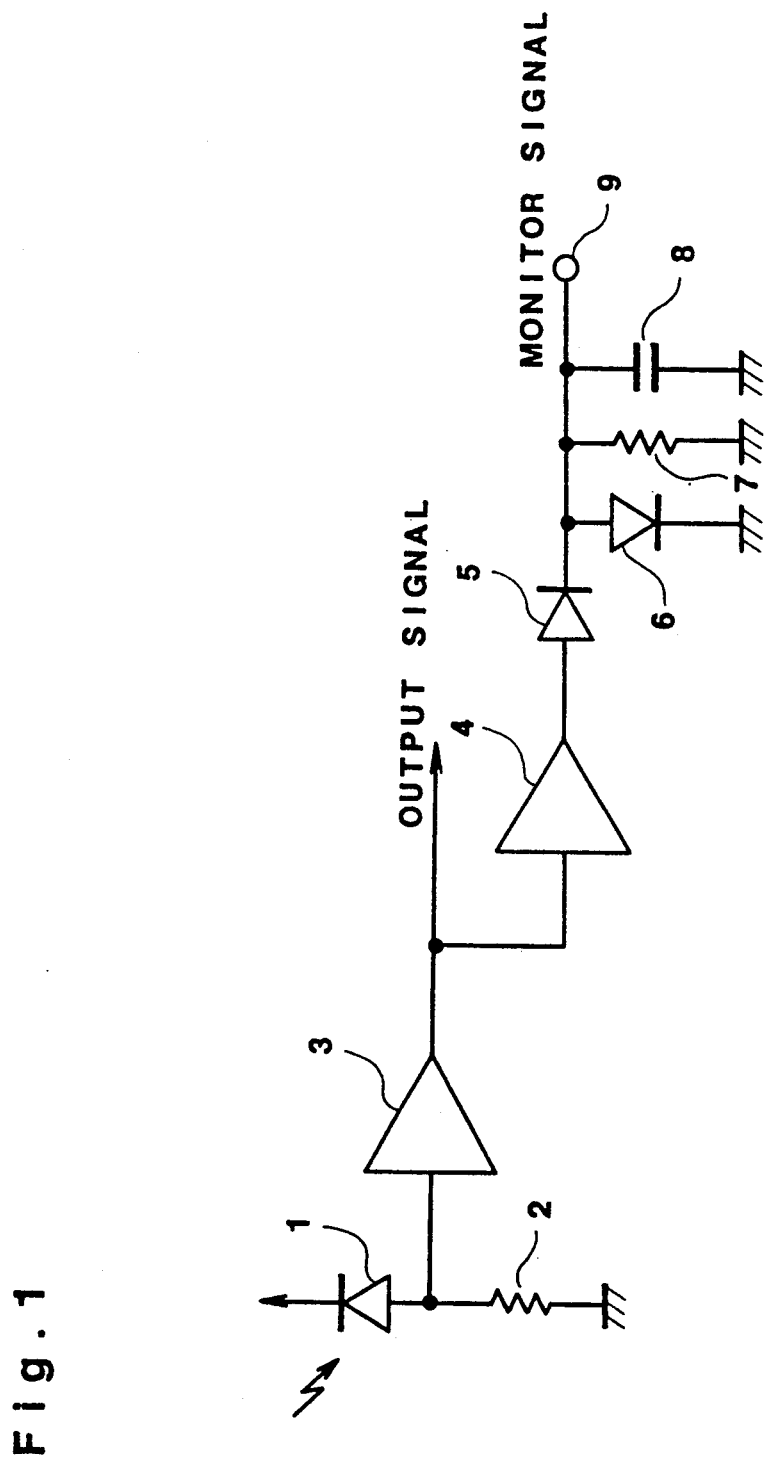
FIG. 1 is a circuit diagram of a conventional light-receiving circuit.
Figure 2A:
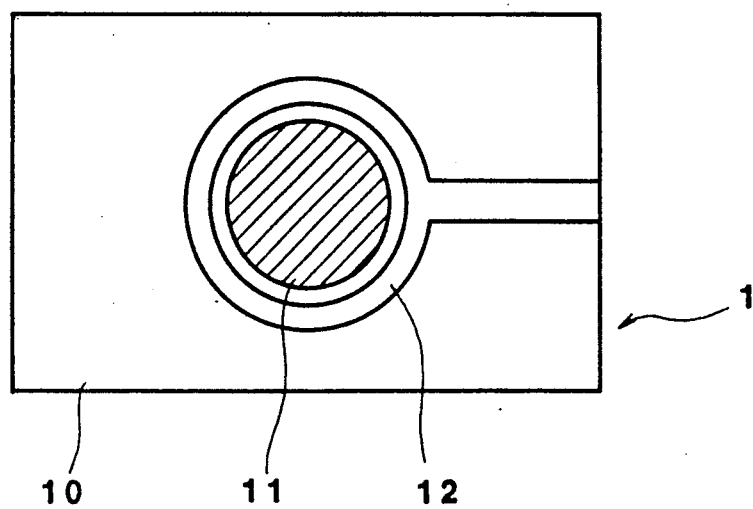
FIG. 2A is a plan view showing a structure of a conventional light-receiving element shown in FIG. 1.
Figure 2B:
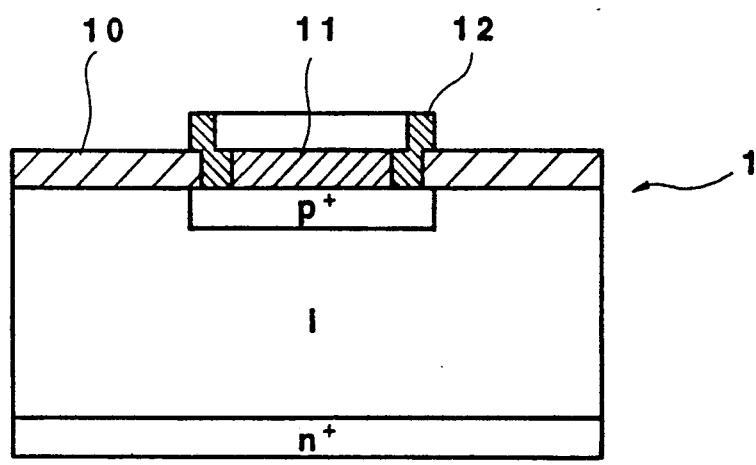
FIG. 2B is a sectional view showing the structure of the conventional light-receiving element shown in FIG. 1.
Figure 3A:
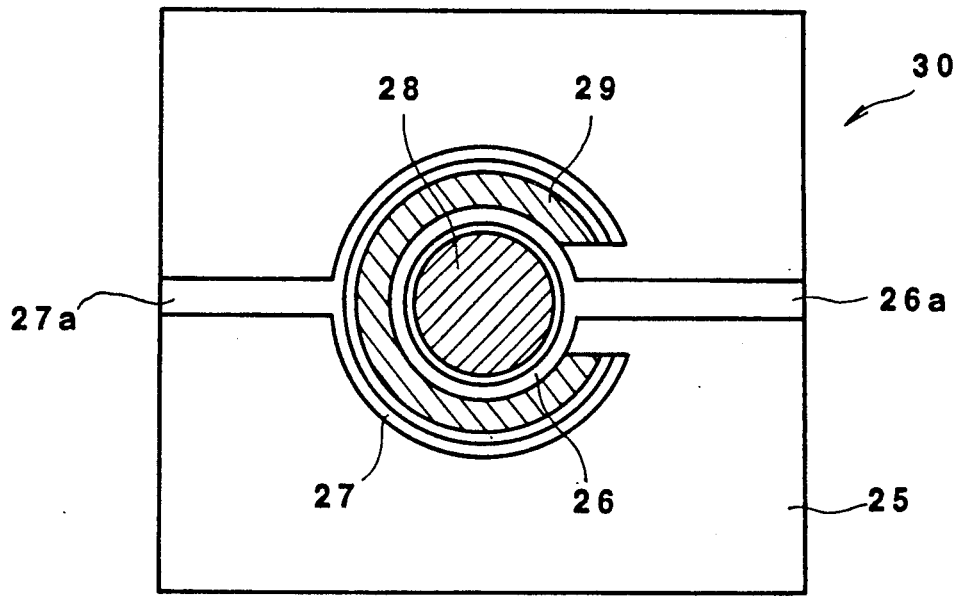
FIG. 3A is a plan view showing a structure of a PIN photodiode according to an embodiment of the present invention.
Figure 3B:
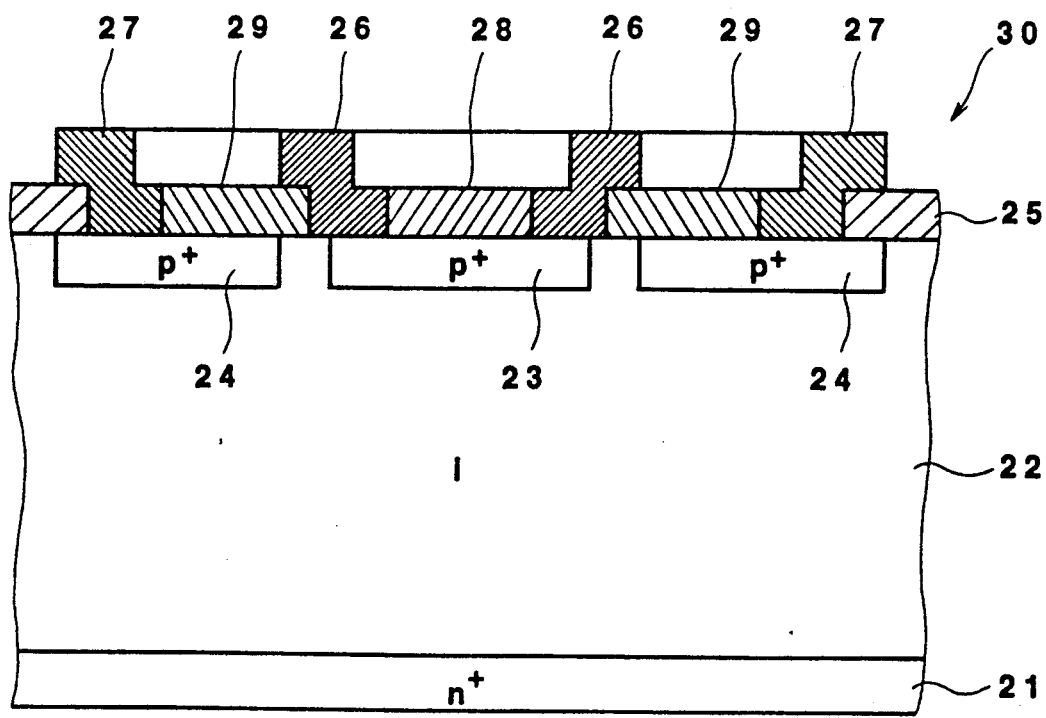
FIG. 3B is a sectional view shown in the structure of the PIN photodiode according to the embodiment of the present invention.

FIGS. 3A and 3B show a structure of a PIN photodiode according to an embodiment of the present invention. FIG. 3A is a plan view, and FIG. 3B is an enlarged longitudinal sectional view of FIG. 3A.

An intrinsic (i-type) semiconductor layer 22 is formed on an n$^+$-type semiconductor layer 21, and p$^+$-type semiconductor layers 23 and 24 are formed in a predetermined region in a surface portion of i-type semiconductor layer 22 to be electrically isolated from each other. An SiO$_2$ film 25 is formed on the p$^+$-type semiconductor layers 23 and 24, and a portion of the SiO$_2$ film 25 on the predetermined region is removed. Electrically isolated metal walls 26 and 27 are formed on the removed portion to be in electrical contact with the p$^+$-type semiconducter layers 23 and 24, thus forming two light-receiving surfaces 28 and 29. Portions of the metal walls 26 and 27 externally extend to form lead portions 26a and 27a. Note the SiO$_2$ film 25 serves as an anti-reflection film of light radiated on the active area 28 and 29.

Figure 4:
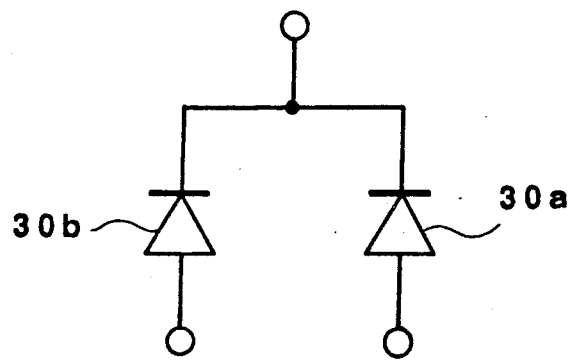
FIG. 4 is an equivalent circuit diagram of the PIN photodiode shown in FIGS. 3A and 3B.

FIG. 4 is an equivalent circuit diagram of a PIN photodiode 30 with the above structure. The PIN photodiode 30 is expressed as a parallel circuit of two PIN photodiodes 30a and 30b. The PIN photodiode 30a is constituted by the n$^+$-type semiconductor layer 21, the i-type semiconductor layer 22, and the p$^+$-type semiconductor layer 23, and its surface 28 serves as the active area. The PIN photodiode 30b is constituted by the n+-type semiconductor layer 21, the i-type semiconductor layer 22, and the p+-type semiconductor layer 24, and its surface 29 serves as the active area.

In this structure, a light signal is emitted from an optical fiber for transmitting light information toward the active area 28 located at a central portion. Most of the light signals are radiated on the active area 28, and its leakage light component is also radiated on the active area 29 located around the active area 28. Note that the leakage light component means a light component which is not radiated on the active area 28 of light emitting from the optical fiber. For this reason, a light output current for information transmission is generated by the light signal radiated on the active area 28, and a monitor output optical current is generated by the leakage light component of the light signal radiated on the active area 29. These output optical currents are output to an external circuit via the lead portions 26a and 27a of the metal walls 26 and 27. When a single-mode fiber having a core diameter of 10 μm is used as the optical fiber, the active area 28 for information transmission appropriately has a diameter of 30 to 50 μm.

Figure 5:
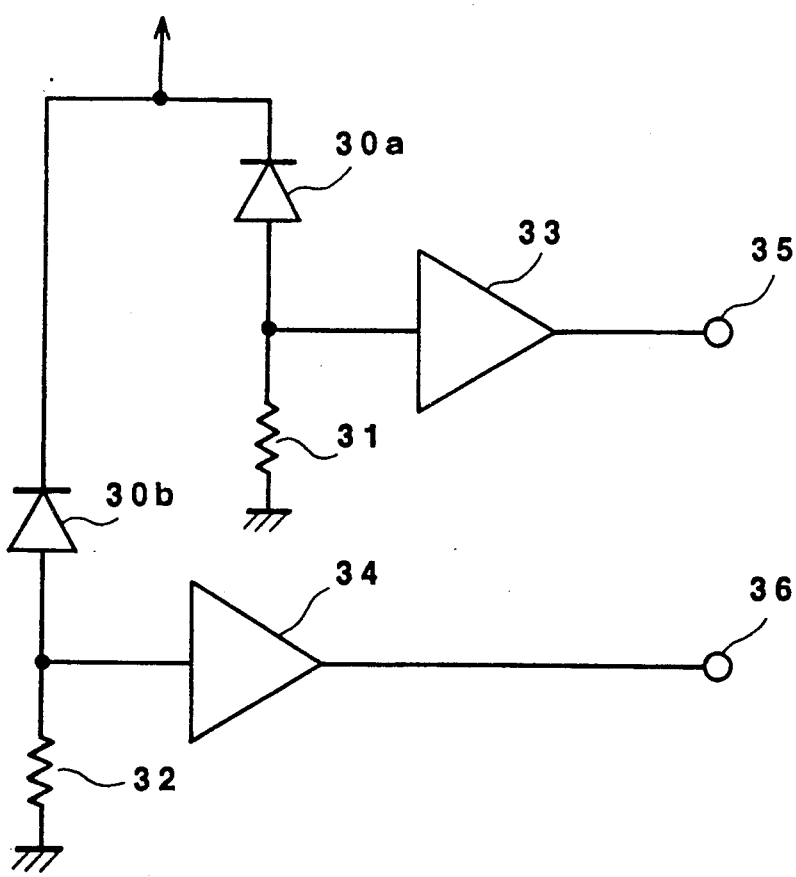
FIG. 5 is a circuit diagram of the light-receiving circuit constituted by using the PIN photodiode shown in FIGS. 3A and 3B.

FIG. 5 shows a light-receiving circuit using this PIN photodiode 30.

The cathodes of the PIN photodiodes 30a and 30b are electrically connected to each other, and are boosted to a power supply voltage of the circuit. The anodes of the PIN photodiodes 30a and 30b are grounded through resistors 31 and 32, respectively, and are also connected to the input terminals of amplifiers 33 and 34, respectively. The output terminals of the amplifiers 33 and 34 are respectively connected to terminals 35 and 36. A circuit constituted by the PIN photodiode 30a, the resistor 31, and the amplifier 33 is a normal light-receiving circuit. This light-receiving circuit is set to have a receiver bandwidth corresponding to a transmission speed of information. A circuit constituted by the PIN photodiode 30b, the resistor 32, and the amplifier 34 is a monitor circuit. Since this monitor circuit need only to detect an average level of a modulated light signal, it preferably has a large time constant. The resistor 32 preferably has a high resistance to get high sensitivity, and is set to be about 1 MΩ.

In this structure, when a light signal is radiated on the active area 28, an output optical current is generated by the PIN photodiode 30a, and is converted into a voltage signal by the resistor 31. The voltage signal is supplied to the amplifier 33. The signal received by the amplifier 33 is amplified, and information transmitted through the optical fiber is demodulated and output to the terminal 35. At the same time, the leakage light component of the received light signal is radiated on the active area 29, and an output optical current according to the leakage light component is generated by the PIN photodiode 30b. The output optical current is amplified by the amplifier 34, and is output to the terminal 36 as a monitor signal for determining the presence/absence of an input optical signal.

According to the present invention, a leakage light component which is not positively utilized and is not radiated on the active area 28 is received by the active area 29. For this reason, a light input can be monitored without giving a disturbance to a demodulated signal obtained from the amplifier 33.

From the invention thus described, it will be obvious that the invention may be varied in many ways. Such variations are not to be regarded as a departure from the spirit and scope of the invention, and all such modifications as would be obvious to one skilled in the art are intended to be included within the scope to the following claims.

I claim:

1. A light receiving device comprising:
   (a) a light receiving element including:
      a first active area for receiving a major light component of an input optical signal to generate an optical current in response thereto for use in information transmission; and
      a second active area located so as to surround said first active area, said second active area receiving a leakage light component of said input optical signal to generate a monitor current for use in monitoring said input optical signal;
   (b) first amplifying means connected to said first active area through a first resistor for amplifying said optical current to form a first output signal; and
   (c) second amplifying means connected to said second active area through a second resistor for amplifying said monitor signal,
      said second amplifying means and said second resistor constituting a monitor circuit, said first amplifying means and said first resistor constituting a signal amplifying circuit, and said monitor circuit having a time constant which is larger than that of said signal amplifying circuit.

* * * * *